(12) United States Patent
Qiu

(10) Patent No.: US 7,640,447 B2
(45) Date of Patent: Dec. 29, 2009

(54) POWER SUPPLY SYSTEM HAVING STANDBY POWER

(75) Inventor: Xun-Chun Qiu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 544 days.

(21) Appl. No.: 11/309,275

(22) Filed: Jul. 21, 2006

(65) Prior Publication Data

US 2007/0076506 A1    Apr. 5, 2007

(30) Foreign Application Priority Data

Sep. 30, 2005    (CN) .................. 2005 1 0100073

(51) Int. Cl.
G06F 1/28    (2006.01)
(52) U.S. Cl. ...................... 713/340; 713/300
(58) Field of Classification Search ................. 713/300, 713/310, 330, 340
See application file for complete search history.

(56) References Cited

U.S. PATENT DOCUMENTS

| | | | |
|---|---|---|---|
| 4,427,899 A | | 1/1984 | Bruns |
| 4,704,542 A | | 11/1987 | Hwang |
| 5,204,610 A | * | 4/1993 | Pierson et al. ............... 320/126 |
| 5,517,153 A | * | 5/1996 | Yin et al. ..................... 327/546 |
| 6,310,497 B1 | * | 10/2001 | Strauss ........................ 327/143 |
| 2004/0160330 A1 | * | 8/2004 | McClure et al. ............. 340/663 |

FOREIGN PATENT DOCUMENTS

CN    2596670 Y    12/2003

* cited by examiner

Primary Examiner—Dennis M Butler
(74) Attorney, Agent, or Firm—Wei Te Chung

(57) ABSTRACT

A power supply system for selectively supplying a main power and a standby power to a computer is provided. The power supply system comprises a transistor including a first terminal, a second terminal and a third terminal. The first terminal being coupled to a motherboard power source, the second terminal being coupled to a standby power source, and a voltage output port electrically connected to the third terminal of the transistor. The motherboard power source comprises a first Direct Current (DC) battery, a first resistor and a diode, the first resistor is in series between an anode of the first DC battery and an anode of the diode, a cathode of the first DC battery is grounded, and a cathode of the diode is electrically connected to the voltage output port.

11 Claims, 2 Drawing Sheets

POWER SUPPLY SYSTEM HAVING STANDBY POWER

FIELD OF THE INVENTION

The invention relates in general to a power supply system having a standby power.

DESCRIPTION OF RELATED ART

Basic input output system (BIOS) is a set program preserved in a read only memory (ROM) on a motherboard of a computer, the BIOS is used to set and control hardware of the computer.

Complementary metal oxide semiconductor (CMOS) is a memory to store the parameters and data which are set by the BIOS. A motherboard battery supplies power to the CMOS to retain the parameters and data after the computer is powered off. Usually a lithium battery is mounted on a motherboard of a computer to supply power to the CMOS when the computer is powered off, but the lithium battery can be used no more than 3 years, and if the power of the lithium battery is exhausted or the power is not enough, the parameters and data stored in the CMOS are lost. Furthermore, even if a user changes the lithium battery before it becomes too weak the parameters and data stored in the CMOS is still lost when the battery is removed.

What is needed is a power supply system that provides standby power to the CMOS while a motherboard power source in a computer is changed.

SUMMARY OF THE INVENTION

An exemplary power supply system for selectively supplying a main power source and a standby power source to a computer comprises a transistor including a first terminal, a second terminal and a third terminal. The first terminal being coupled to a motherboard power source, the second terminal being coupled to a standby power source, and a voltage output port electrically connected to the third terminal of the transistor. The motherboard power source comprises a first Direct Current (DC) battery, a first resistor and a diode, the first resistor is in series between an anode of the first DC battery and an anode of the diode, a cathode of the first DC battery is grounded, and a cathode of the diode is electrically connected to the voltage output port.

Other advantages and novel features will become more apparent from the following detailed description when taken in conjunction with the accompanying drawing, in which:

DETAILED DESCRIPTION OF THE INVENTION

Figure 1:
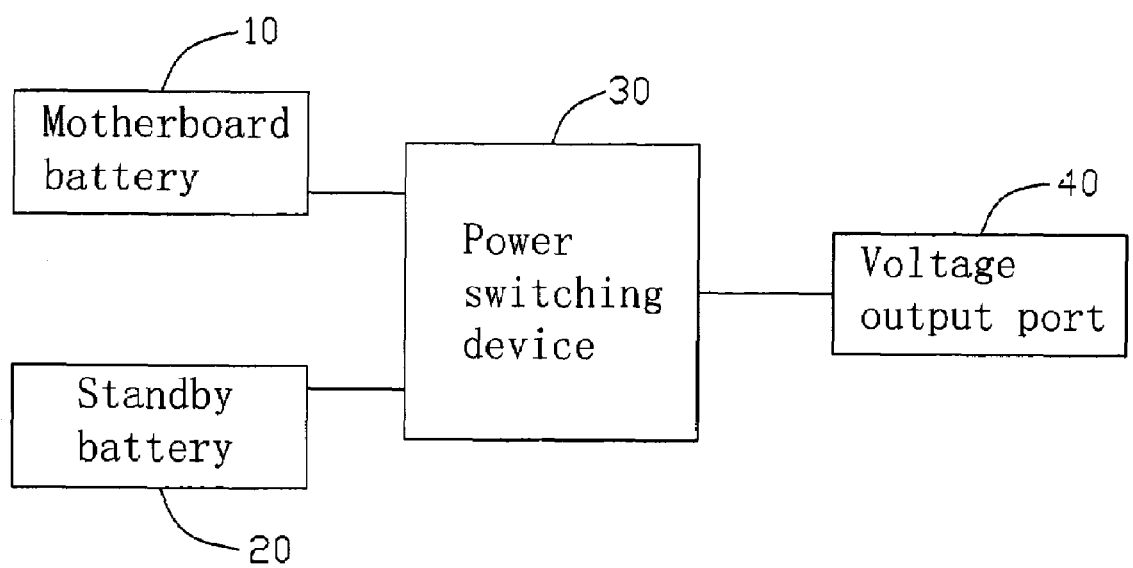
FIG. 1 is a block diagram of a power supply system in accordance with a preferred embodiment of the present invention.

Refers to FIG. 1, a power supply system in accordance with a preferred embodiment of the present invention is shown. The power supply system for generating a main power and a standby power applied to a complementary metal oxide semiconductor (CMOS) on a motherboard of an electronic device like a computer includes a motherboard/main power source 10, a standby power source 20, a power switching device 30, and a voltage output port 40. The motherboard power source 10 is used to generate the main power, and the standby power source 20 is used to generate the standby power. The motherboard power source 10 and the standby power source 20 both are electrically coupled with the power switching device 30 to supply the main power and the standby power to the power switching device 30. The power switching device 30 is controlled by a state of the main power supplied by the motherboard power source 10 and selectively outputs the main power and the standby power to the voltage output port 40. The main power and the standby power are applied to the CMOS to retain parameters and data set by a basic input output system (BIOS) through the voltage output port 40.

Figure 2:
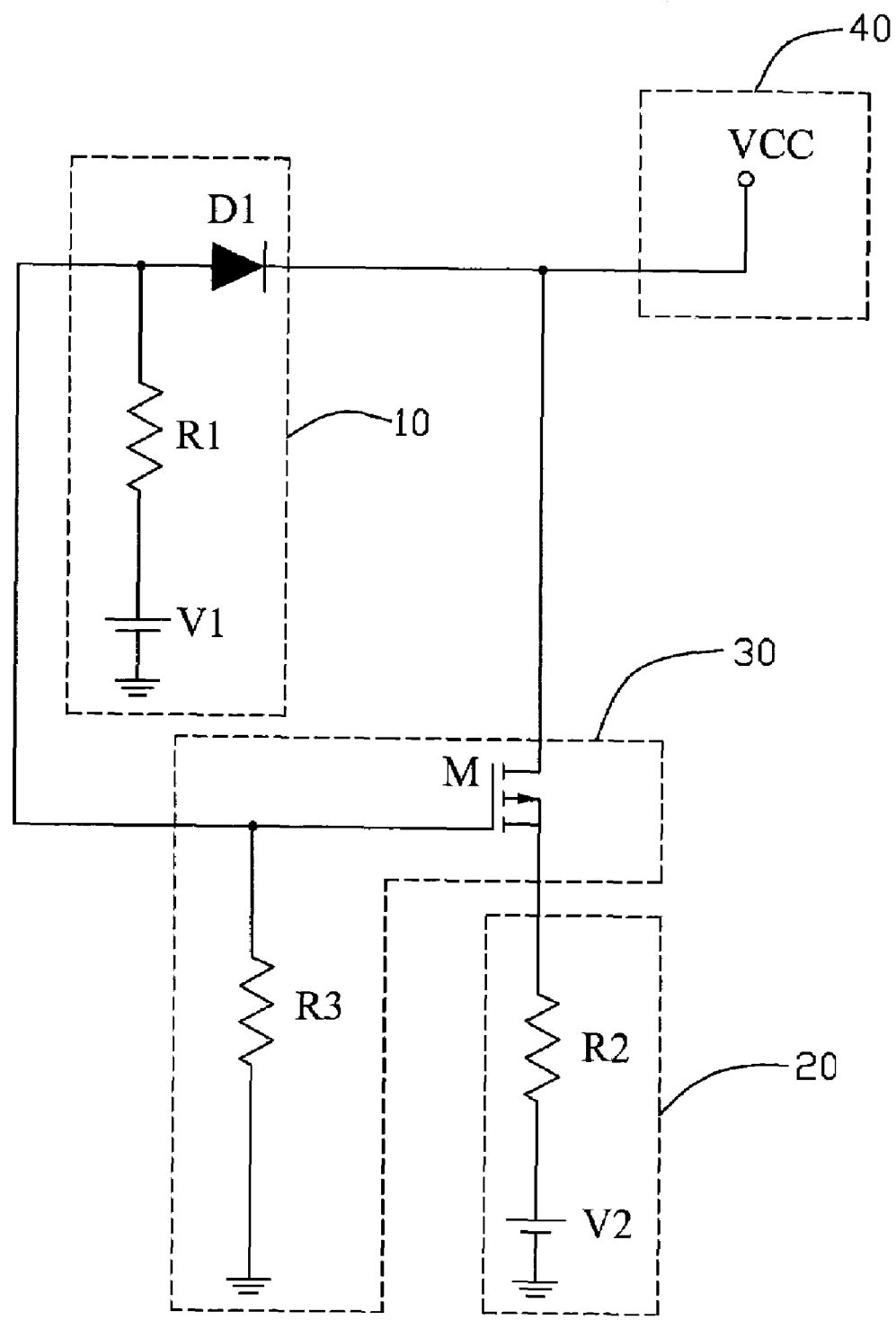
FIG. 2 is a circuit diagram of the power supply system of FIG. 1.

Referring to FIG. 2, circuitry for use in the power supply system in accordance with the preferred embodiment of the present invention is shown. The motherboard power source 10 includes a first direct current (DC) battery V1, a first resistor R1, and a diode D1. The first resistor R1 is connected in series between an anode of the first DC battery V1 and an anode of the diode D1, a cathode of the first DC battery V1 is grounded, and a cathode of the diode D1 is electrically connected to the voltage output port 40. The DC battery V1 can be a lithium battery, a nickel-cadmium battery, or a nickel-hydrogen battery and so on.

The standby power source 20 includes a second DC battery V2 and a second resistor R2. A first end of the second resistor R2 is electrically connected to an anode of the second DC battery V2, and a cathode of the second DC battery V2 is grounded.

The power switching device 30 includes a p-channel metal oxide semiconductor (PMOS) transistor M and a third resistor R3. A gate of the PMOS transistor M is grounded via the third resistor R3 and connected to the anode of the diode D1. A source of the PMOS transistor M is connected to a second end of the second resistor R2, and a drain of the PMOS transistor M is connected to the voltage output port 40.

When the motherboard power source 10 works normally the first DC battery V1 provides a high voltage to the gate of the PMOS transistor M via the first resistor R1 and the second resistor R2. At this time the PMOS transistor M is cut off and the diode D1 is turned on. The first DC battery V1 provides a main power VCC to the voltage output port 40 via the first resistor R1 and the diode D1.

When the first DC battery V1 fails to provide enough power to the voltage output port 40, or is removed for changing, the gate of the PMOS transistor M gets a low voltage and is turned on and simultaneously the diode D1 is cut off. The second DC battery V2 provides a standby power to the voltage output port 40 via the second resistor R2 and the PMOS transistor M.

Once sufficient power is again provided by the first DC battery V1, the PMOS transistor M shuts off and the diode D1 is turned on again, thus allowing the first DC battery to take over again.

Because the standby power source 20 provides a standby power to the CMOS during battery changing or low power, the CMOS can retain the parameters and data safely.

It is believed that the present embodiment and its advantage will be understood from the foregoing description, and it will be apparent that various changes may be made thereto without departing from the spirit and scope of the invention or sacrificing all of its material advantage, the example hereinbefore described merely being preferred or exemplary embodiment.

What is claimed is:

1. A power supply system for selectively supplying a main power and a standby power to a computer, the power supply system comprising:

a transistor including a first terminal, a second terminal, and a third terminal, the first terminal being coupled to a motherboard power source, the second terminal being coupled to a standby power source; and a voltage output port electrically connected to the third terminal of the transistor;

wherein the motherboard power source comprises a first direct current (DC) battery, a first resistor, and a diode, the first resistor is connected in series between an anode of the first DC battery and an anode of the diode, a cathode of the first DC battery is grounded, and a cathode of the diode is connected to the voltage output port.

2. The power supply system as claimed in claim 1, wherein the transistor is a channel metal oxide semiconductor (pMOS) transistor, the first terminal is a gate, the second terminal is a source, and the third terminal is a drain.

3. The power supply system as claimed in claim 1 wherein the standby power source comprises a second DC battery and a second resistor, the second resistor is connected in series between the second terminal of the transistor and an anode of the second DC battery, and a cathode of the second DC battery is grounded.

4. The power supply system as claimed in claim 1, wherein the first terminal of the transistor is grounded via a third resistor and connected to the anode of the diode.

5. A power supply system for selectively supplying a main power source and a standby power source to a computer, the power supply system comprising:

a motherboard power source comprising a diode;

a transistor comprising a first terminal, a second terminal, and a third terminal, the first terminal being coupled to the motherboard power source, the second terminal being coupled to a standby power source, and the third terminal being coupled to a voltage output port;

wherein the transistor selectively provides power to the computer according to a working state of the main power source and a working state of the standby power source in response to a switching state of the diode.

6. The power supply system as claimed in claim 5, wherein the transistor is a p-channel metal oxide semiconductor (pMOS) transistor, the first terminal is a gate, the second terminal is a source, and the third terminal is a drain.

7. The power supply system as claimed in claim 5, wherein the motherboard power source comprises a first direct current (DC) battery, a first resistor, and a diode, the first resistor is connected in series between an anode of the first DC battery and an anode of the diode, a cathode of the first DC battery is grounded, and a cathode of the diode is connected to the third terminal.

8. The power supply system as claimed in claim 7, wherein the first terminal of the transistor is grounded via a third resistor and connected to the anode of the diode.

9. A system for power-supplying an electronic device, comprising:

a main power source of said system electrically connected to an electronic device and a diode to supply power to said electronic device;

a standby power source of said system electrically connected to said electronic device to supply power to said electronic device when said main power source is below a predetermined voltage; and a switching device electrically connected between said standby power source and said electronic device so as to control power supply of said standby power source to said electronic device, said switching device further electrically connected to said main power source in order to switch control of said switching device on said standby power source based on a switching state of the diode.

10. The system as claimed in claim 9, wherein said switching device comprises a p-channel metal oxide semiconductor (pMOS) transistor, a gate of said pMOS transistor is electrically connectable connected to said main power source, a source of said pMOS transistor is electrically connected to said standby power source, and a drain of said pMOS transistor is electrically connected to said electronic device.

11. The system as claimed in claim 9, wherein the switching device further comprises a first resistor to be grounded.

* * * * *

UNITED STATES PATENT AND TRADEMARK OFFICE
CERTIFICATE OF CORRECTION

PATENT NO. : 7,640,447 B2  
APPLICATION NO. : 11/309275  
DATED : December 29, 2009  
INVENTOR(S) : Xun-Chun Qiu Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 705 days.

Signed and Sealed this

Ninth Day of November, 2010

David J. Kappos  
*Director of the United States Patent and Trademark Office*